United States Patent [19]

Sharma et al.

[11] Patent Number: 4,977,617
[45] Date of Patent: Dec. 11, 1990

[54] MIXER

[75] Inventors: Rakesh Sharma, Chelmsford; Boleslaw M. Sosin, Boreham, both of United Kingdom

[73] Assignee: The Marconi Company Limited, Stanmore, United Kingdom

[21] Appl. No.: 453,130

[22] Filed: Dec. 12, 1989

Related U.S. Application Data

[63] Continuation of Ser. No. 244,129, Sep. 14, 1988, abandoned.

[30] Foreign Application Priority Data

Sep. 18, 1987 [GB] United Kingdom ................. 8721978

[51] Int. Cl.$^5$ ............................ H04B 1/28; H04B 110
[52] U.S. Cl. .................... 455/319; 455/325; 455/333
[58] Field of Search ............... 455/317, 318, 319, 325, 455/326, 327, 333; 330/277

[56] References Cited

U.S. PATENT DOCUMENTS

| 3,383,601 | 5/1968 | Squires | 325/340 |
|---|---|---|---|
| 4,079,415 | 3/1978 | Will | 358/86 |
| 4,592,095 | 5/1986 | Ohnishi et al. | 455/327 |
| 4,677,692 | 6/1987 | Sakashita et al. | 455/319 |

FOREIGN PATENT DOCUMENTS

| 3409555 | 10/1984 | Fed. Rep. of Germany . |
|---|---|---|
| WO87/02842 | 5/1987 | PCT Int'l Appl. . |
| 1008540 | 10/1965 | United Kingdom . |
| 1092586 | 11/1967 | United Kingdom . |
| 1104928 | 3/1968 | United Kingdom . |
| 1226749 | 3/1971 | United Kingdom . |
| 1305698 | 2/1973 | United Kingdom . |

OTHER PUBLICATIONS

Article entitled "Improve Double-Balanced Mixer Response with an Active-Circuit Design", *Electronic Design*, vol. 26, No. 6 (1978).

Primary Examiner—Benedict V. Safourek
Assistant Examiner—Ralph Smith
Attorney, Agent, or Firm—Kenneth Watov

[57] ABSTRACT

A mixer incorporating FET's (4,5) as the switching elements includes a resonant circuit connected as a tank circuit of the local oscillator (6) such that the inherence capacitance of the FET's is automatically compensated for. The harmonic recovery technique is also used by the inclusion of rejection filters at the input and output of the system, which rejection filters have reciprocal impedance characteristics, such as short circuit/open circuit or the like.

11 Claims, 4 Drawing Sheets

MIXER

This is a continuation of application Ser. No. 07/244,129, filed Sept. 14, 1988, now abondoned.

FIELD OF THE INVENTION

This invention relates to a mixer of the type which receives an input signal and a signal from a local oscillator and provides as an output a signal at an intermediate frequency (i.f).

Such mixers are typically used in communication systems, particular in the receiver end of a system. The mixer generally comprises a signal input, an input from a local oscillator at a predetermined frequency and one or more switching elements which multiply the two inputs to provide the i.f output at sum or difference frequency. The elements most commonly used as switching elements are diodes but transistors in particular FET's can provide accurate fast switching at lower power requirements from the local oscillator.

Previous high performance mixers using FETs still required a considerable power at a local oscillator frequency due to inherent input (gate) capacity of the FET's. The Broadband matching network incorporating this capacity also incorporates low resistance which dissipates the power. If the mixer is to be used in a manner that it conserves power as much as possible, which is clearly advantageous, then somehow the inherent input capacity must be tuned out. The present invention provides a method of achieving this.

SUMMARY OF THE INVENTION

According to the present invention there is provided a mixer comprising a signal input, a local oscillator, a switching element having one or more control electrodes and a resonant circuit connected directly across the control electrodes Preferably, the resonant circuit is of high Q which may be obtained by making the resonant circuit a tank circuit forming part of the oscillator. The switching elements will preferably be FET's, but may be other elements such as dipolar transistors.

The voltage applied to the switching elements is controlled by the limiting action of the oscillator. This provides the advantage that the switching elements can always be used at their maximum voltage as frequency is changed.

In operation, by the switching action of the mixer, the power of the local oscillator at the frequency fo is multiplied by the signal power at the incoming frequency fr to produce an output signal at a sum frequency (fo+fr) and a difference frequency (fo−fr), one of which is chosen as the derived output, the other represents an undesired power at so called image frequency. Furthermore, due to imperfect multiplication many other undesired signals are produced at frequencies (nfo±m fr) where n and m are positive integers. All these unwanted output signals detract power from the derived output signal introducing high loss.

The conversion loss between the RF input and i.f. output may be minimised by careful choice of reactive termination for the image and second harmonic frequencies. By terminating the RF and input ports reactively for the image and other unwanted frequencies the power at these frequencies is contained and converted back into the fundamental frequency. Thus the power output of the i.f. output can be improved. Such a technique is known as a harmonic recovery technique.

Accordingly, the invention may further include rejection filters connected directly to the switching devices at the input and output, which filters present a mismatch at frequencies other than the input and i.f frequencies and have mutually reciprocal impedance characteristics.

For the recovery to operate properly, the phase reactive impedances of the RF and output parts as seen at the connection point to the mixer switching elements must be reciprocal, i.e. short circuit versus open circuit, open circuit versus short circuit, high capacitance versus high inductance etc.

Preferably, one filter acts as an open circuit and the other filter acts as a short circuit for frequencies other than the desired RF and i.f frequencies.

By making use of the Harmonic Recovery Technique the efficiency of the mixer is enhanced. Furthermore, a receiver configuration with a low noise Figure can be designed by using such mixers.

Embodiments of the invention will now be described by way of example only with reference to the accompanying drawings.

DESCRIPTION OF THE PREFERRED EMBODIMENTS OF THE INVENTION

Figure 1:
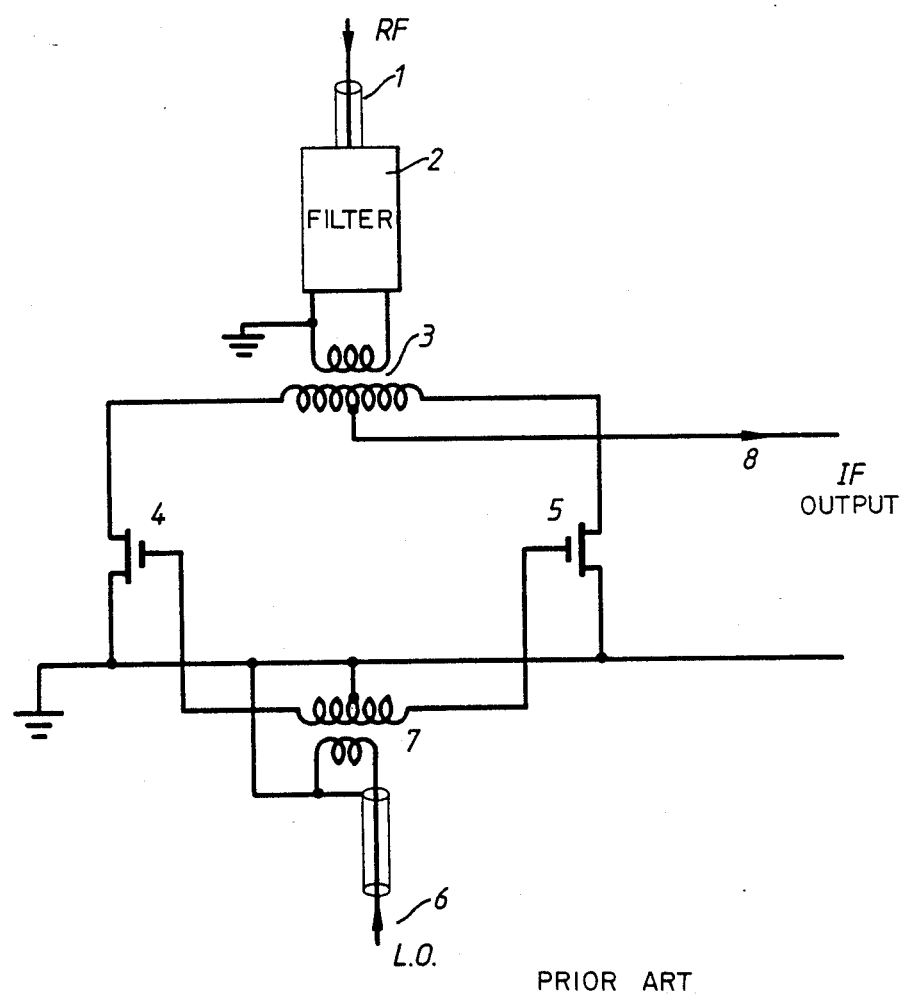
FIG. 1 shows schematically a mixer for generating an intermediate frequency output from RF and local oscillator inputs.

Referring to FIG. 1, there is shown a mixer comprising an RF input 1 feeding an input filter 2 connected to the primary winding of a transformer 3. The secondary of the transformer is connected to the respective drain connections of two FETs 4 and 5 which are the switching elements of the mixer.

The gates of the FETs are fed by a local oscillator 6 via unbalanced to balance transformer 7. An i.f output 8 is taken from the transformer 3 and thus the FETs perform a switching function which serves to mix the RF signal and the signal for the local oscillator (LO) 6. It will be appreciated that FIG. 1 is only schematic of the basic single balanced mixer, since the functioning of such a mixer is well known.

Figure 2:
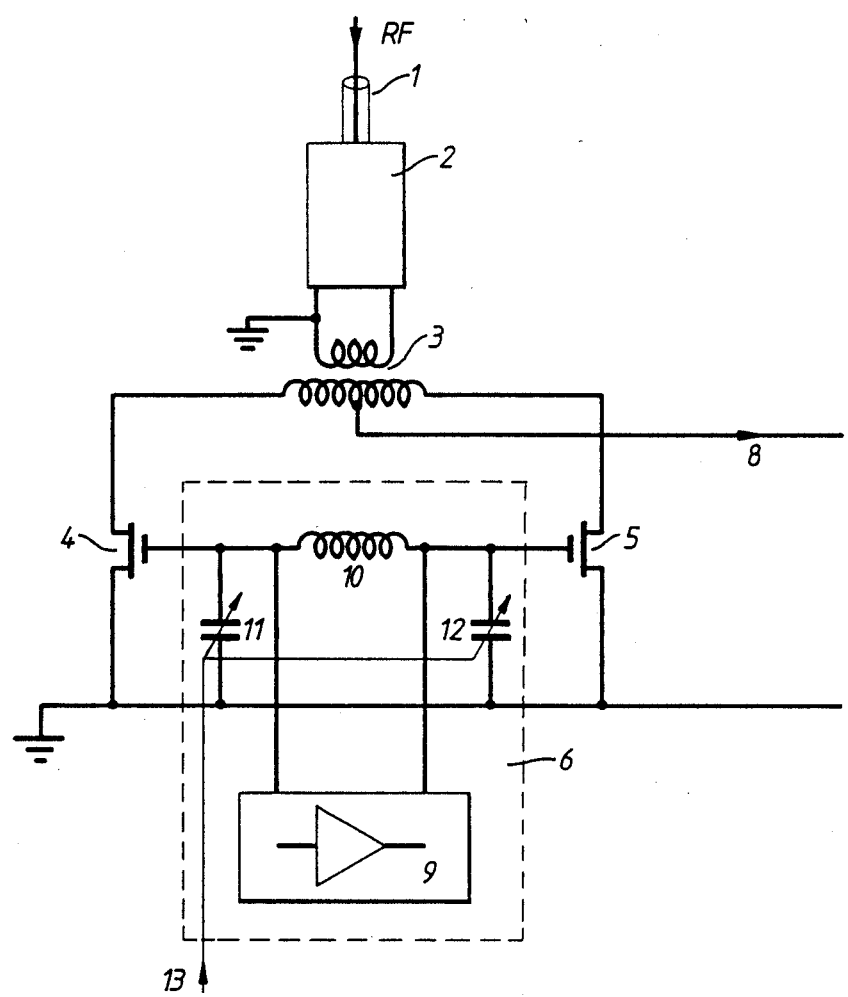
FIG. 2 shows a mixer according to the invention.

FIG. 2 shows an embodiment of the present invention in which an RF input 1 is filtered by input filter 2 and applied to the primary of transformer 3. The switching elements used in this case are FET transistors 4 and 5 similarly to FIG. 1. The oscillator 6, now a part of the mixer, comprises a maintaining amplifier 9 and an oscillator tank circuit which comprises an inductance 10 and two capacitors 11 and 12.

In order to change the frequency, variable capacitors are shown and the oscillator may be tuned mechanically (13). Alternatively a variable inductor may be used. However, one method can involve replacing part of the capacity of the capacitors 11 and 12 by varactor diodes (not shown) and tuning the oscillator by a control voltage.

It is seen that the oscillator tank circuit is integrated into the switching transistors 4 and 5. An i.f output 8 is taken from the output from the switching transistors. The provision of a resonant tank of the oscillator connected directly to the gates of the FETs means that the effects due to the inherent capacitance of the FETs are immediately and automatically allowed for and compensated in the tuning of the oscillator tank. The effective very high Q-factor of the tank circuit of the oscillator eliminates spurious signals appearing at the control electrodes of the switching elements i.e. the gates of the FET's, and contributes greatly to the high performance of the mixer.

Figure 3:
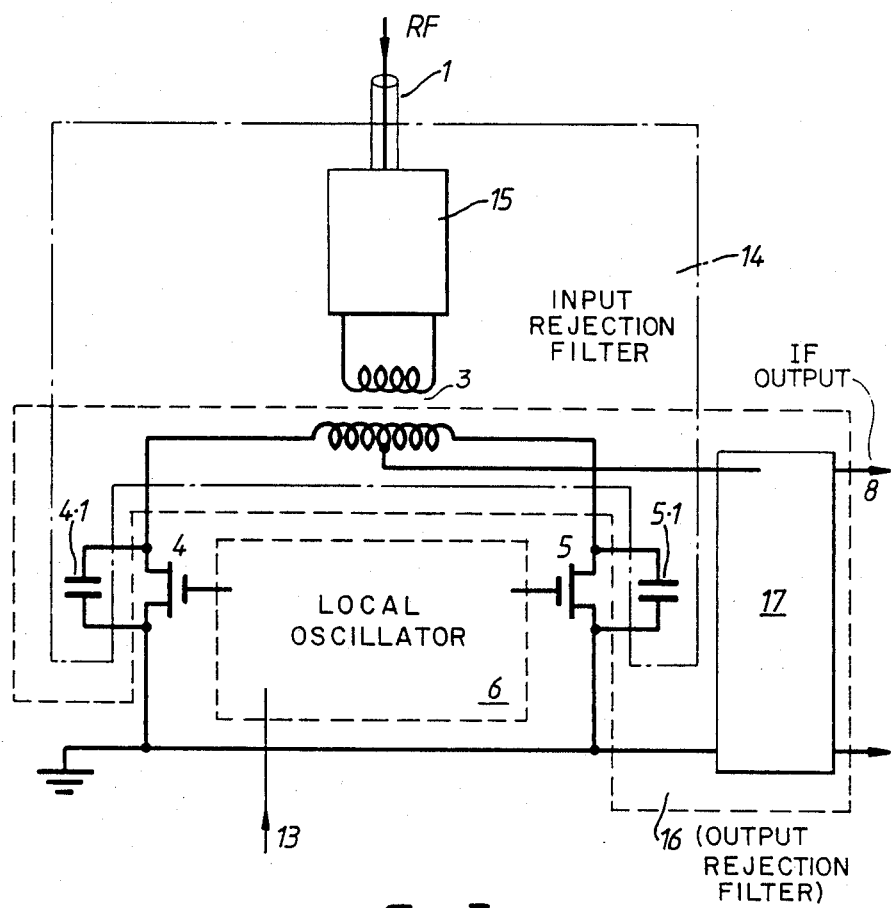
FIG. 3 shows a mixer according to the invention and including the provision of a harmonic recovery technique.

Referring now to FIG. 3 there is shown an apparatus which uses the harmonic recovery technique outlined above It is seen that the circuit is similar to that of FIG. 2 and includes the oscillator 6.

In practise, switching elements 4 and 5 inevitably have an unwanted capacity access their terminals shown here as 4.1 and 5.1 respectively. The input circuit 2 of FIG. 2 now becomes input/rejection filter 14 and must present the required impedance to the switching elements. This implies that the capacitances 4.1 and 5.1 as well as the transformer are part of this filter. Block 15 indicates further elements of the filter which will be according to standar filter design. The design of filters for any specification is known, hence it is not elaborated further. In a similar manner the output/rejection filter 16 is constructed containing other elements in block 17.

The transformer 3 also has unwanted elements of capacitances and leakage inductances; these are included into the filters in push-pull and parallel mode respectively.

It will be noted that some components are used as part of both filters at specific impedances. It has not previously been realised that this is achievable. Furthermore those common components are connected effectively in series for one of the filters and in parallel for the other.

In order to determine the minimum values of the input and output impedances of the circuit in order that full benefit is achieved, the following parameters are used.

$$n = \left[ \frac{Ro}{Rs} \right]^{\frac{1}{2}} \text{ and } p = [Ro\, Rs]^{\frac{1}{2}} \quad (1)$$

Where Ro and Rs are respectively the open and short circuit resistances of the switches 4,5 which are of course, being real switches, imperfect (for a perfect switch $R_s = \infty$ and $R_L = 0$ at all frequencies). When the system is resistively terminated and the input and output impedances are p the minimum conversion loss is 3.92 dB. This is also the best termination when n is low. When n is high the operation of the mixer becomes dependant upon the filter circuits. It has been found that the minimum conversion loss is 0bB if the input and output circuits are matched to image impedances as shown below.

| | Low n | High n |
|---|---|---|
| image impedance at parallel filter circuit | p | 2 p |
| image impedance at series filter circuit | p | p (2) |
| minimum loss | — | 0dB |

These impedances refer to the switching elements. As these are either connected in series or parallel, the value of the termination must be suitably altered.

Using (1) and (2) above, and with a FET of input capacity 2.4pF, such as the siliconix SD214DE, then $$Ro = \frac{1}{2\pi FC} = 925 \text{ ohms}; Rs = 35 \text{ ohms}.$$

$$\text{hence } n = \left[ \frac{925}{35} \right]^{\frac{1}{2}} = 5$$

$$p = [925 \times 35]^{\frac{1}{2}} = 180 \text{ ohms}$$

Applying (2) above and assuming n to be approximately mid-range the circuit of FIG. 3 uses the values $R_L = 150$ ohms and $R_s = 200$ ohms.

Figure 4:
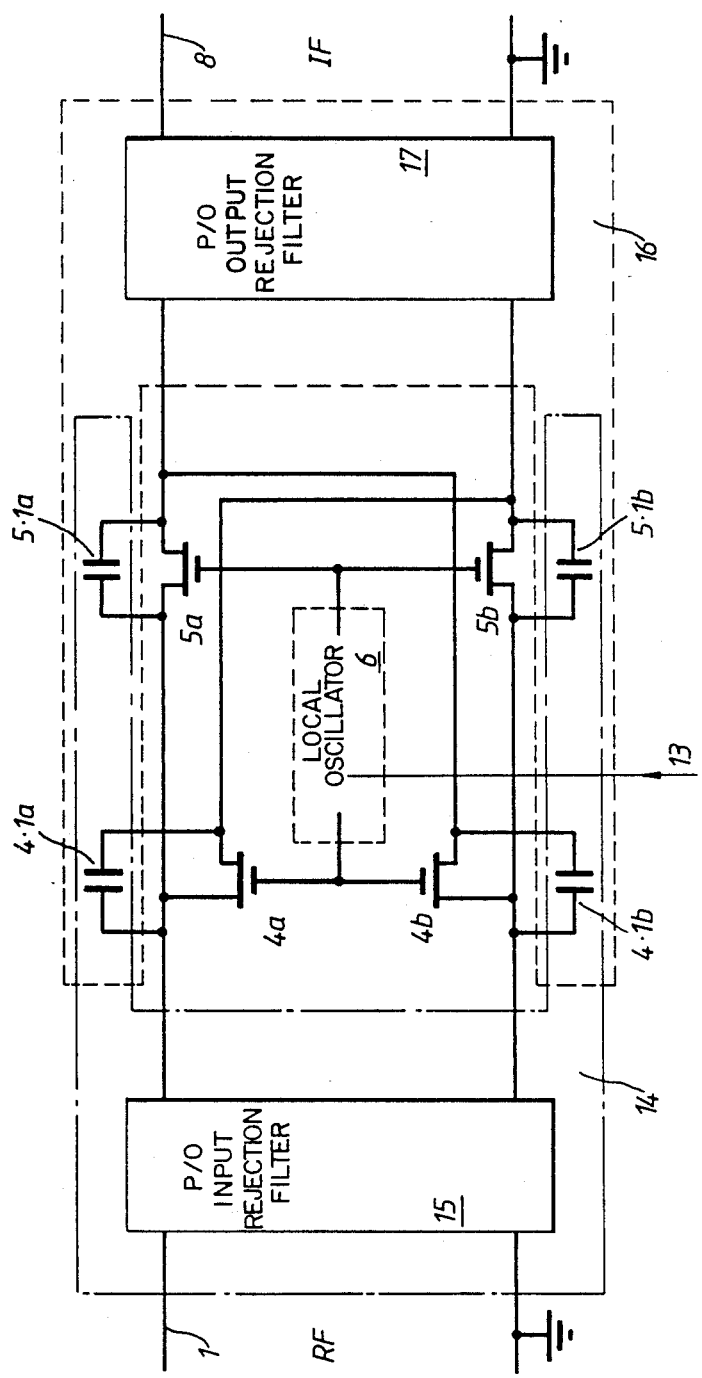
FIG. 4 shows a double balanced mixer using the harmonic recovery technique.

FIG. 4 shows a double balanced mixer embodying the present invention. Double balanced mixers are, per se, well known and can in this case improve on the single balanced design of FIG. 3. Basically, two pairs of switching FETs 4a, 4b, 5a and 5b are used in the design, which accordingly allows the tuned circuits to swap with each other. A problem with a single balanced design is that the harmonics are reconverted into the fundamental and thus twice the unwanted voltage appears at the RF input. The double balanced design of FIG. 4 allows the doubled voltage to appear at the i.f port after the mixer proper. Note also that circuits 15 and 17 do contain balance to unbalance transformers.

What we claim is:

1. A mixer, comprising:
   a local oscillator;
   a first switching element;
   a signal input;
   a signal output;
   an input rejection filter; and
   an output rejection filter;
   wherein said local oscillator is electrically connected directly to a control electrode of said first switching element such that said local oscillator incorporates an inherent capacity between said control electrode and a switched electrode of said first switching element; and
   wherein said input rejection filter has a high reflection coefficient of substantially the opposite phase angle to said output rejection filter, as seen from said first switching element, at frequencies other than the desired input and output frequencies.

2. A mixer as claimed in claim 1, wherein said input rejection filter has reciprocal reactive impedance characteristics to said output rejection filter.

3. A mixer as claimed in claim 1, wherein said local oscillator has a high Q factor.

4. A mixer as claimed in claim 1, wherein said mixer is a balanced mixer.

5. A mixer as claimed in claim 1, wherein said input rejection filter and output rejection filter include the capacitance across one switched electrode and one other electrode of said first switching element.

6. A mixer as claimed in claim 4, further including a transformer, wherein said input and output rejection filters include the reactive components of the transformer, and at least one said switched element of said first switching element.

7. A mixer as claimed in claim 6, wherein said mixer further includes a second switching element.

8. A mixer as claimed in claim 7, wherein said signal input is connected to a primary coil of said transformer, the secondary coil of said transformer being centre tapped to provide said signal output, respective ends of said secondary being connected electrically to one switched electrode of each one of said first and second switching elements, another said switched electrode of each of the latter being connected to a common reference potential.

9. A mixer as claimed in claim 8, wherein said first and second switching elements include field effect transistors, respectively.

10. A mixer as claimed in claim 9, wherein said local oscillator further includes an inductor across which is connected a maintaining amplifier, each end of said inductor being electrically connected to a respective control electrode of said field effect transistors.

11. A mixer as claimed in claim 10, wherein the mixer is a double balanced mixer, and includes two pairs of field effect transistors.

* * * * *